United States Patent
Hashimoto et al.

(10) Patent No.: US 11,978,623 B2
(45) Date of Patent: *May 7, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yoshitomo Hashimoto, Toyama (JP); Katsuyoshi Harada, Toyama (JP); Kimihiko Nakatani, Toyama (JP); Yoshiro Hirose, Toyama (JP); Masaya Nagato, Toyama (JP); Takashi Ozaki, Toyama (JP); Tomiyuki Shimizu, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/983,131

(22) Filed: Nov. 8, 2022

(65) Prior Publication Data
US 2023/0067218 A1  Mar. 2, 2023

Related U.S. Application Data

(63) Continuation of application No. 17/006,466, filed on Aug. 28, 2020, now Pat. No. 11,527,402.

(30) Foreign Application Priority Data

Aug. 30, 2019 (JP) .................... 2019-158563

(51) Int. Cl.
*H01L 21/02* (2006.01)

(52) U.S. Cl.
CPC .. *H01L 21/02172* (2013.01); *H01L 21/02164* (2013.01)

(58) Field of Classification Search
None
See application file for complete search history.

(56) References Cited

U.S. PATENT DOCUMENTS 11,527,402 B2 * 12/2022 Hashimoto ....... H01L 21/02208
2010/0105192 A1  4/2010 Akae et al.
(Continued)

FOREIGN PATENT DOCUMENTS

JP  2008-135633 A  6/2008
JP  2010-153776 A  7/2010
(Continued)

OTHER PUBLICATIONS

Rai et al., "Mechanism of Self-catalytic Atomic Layer Deposition of Silicon Dioxide Using 3—Aminopropryl Triethoxsilane, Water, and Ozone," Chem Mater, 2011, 23, 2312-2316.
(Continued)

*Primary Examiner* — Asok K Sarkar
(74) *Attorney, Agent, or Firm* — Volpe Koenig

(57) ABSTRACT

There is provided a technique that includes: forming an oxide film containing an atom X of a precursor on a substrate by performing a cycle a predetermined number of times. The cycle including non-simultaneously performing: (a) forming a first layer containing a component in which a first group is bonded to the atom X on the substrate by supplying the precursor having a molecular structure in which the first and second groups are bonded to the atom X, to the substrate, the first group containing an alkoxy group, and the second group containing at least one of an amino group, an alkyl group, a halogeno group, a hydroxy group, a hydro group, an aryl group, a vinyl group, and a nitro group; and (b) forming a
(Continued)

second layer containing the atom X by supplying an oxidizing agent to the substrate to oxidize the first layer.

23 Claims, 9 Drawing Sheets

(56) References Cited

U.S. PATENT DOCUMENTS

| | | |
|---|---|---|
| 2013/0295779 A1 | 11/2013 | Chandra et al. |
| 2014/0349492 A1 | 11/2014 | Shimamoto et al. |
| 2018/0233349 A1 | 8/2018 | Smith et al. |

FOREIGN PATENT DOCUMENTS

| | | |
|---|---|---|
| JP | 2013-236073 A | 11/2013 |
| JP | 2018-152554 A | 9/2018 |
| KR | 10-2013-0116210 A | 10/2013 |
| TW | 201903372 A | 1/2019 |
| WO | 2017/136945 A1 | 8/2017 |

OTHER PUBLICATIONS

Korean Office Action dated Nov. 18, 2021 for Korean Patent Application No. 10-2020-0109503.
Japanese Office Action dated Aug. 31, 2021 for Japanese Patent Application No. 2019-158563.
Singapore Search Report dated Jun. 11, 2021, for Singapore Patent Application No. 10202008356T.
Singapore Written Opinion dated Jun. 11, 2021, for Singapore Patent Application No. 10202008356T.
Taiwanese Office Action dated May 24, 2021 for Taiwanese Patent Application No. 109127150.
Korean Office Action issued on Mar. 22, 2024 for Korean Patent Application No. 10-2022-0123512.

* cited by examiner

FIG. 7

|  | Example | | | Comparative example | | |
|---|---|---|---|---|---|---|
|  | Top | Cen | Btm | Top | Cen | Btm |
| Average film thickness [Å] | 56.5 | 55.1 | 54.3 | 48.7 | 51.0 | 50.2 |
| WiW[±%] | 0.8 | 0.8 | 0.6 | 1.3 | 1.4 | 1.7 |
| WtW[±%] | | 2.1 | | | 2.3 | |
| R.I. | | 1.481 | | | 1.481 | |
| Density [g/cm³] | | 2.2 | | | 2.2 | |
| RMS[nm] | | 0.22 | | | 0.26 | |
| Rmax[nm] | | 2.19 | | | 2.52 | |
| Base oxidation thickness [Å] | | 5.8 | | | 13.3 | |

FIG. 9

| Processing temperature [°C] | 500 | 600 | 650 |
|---|---|---|---|
| WiW[±%] | 1.1~1.3 | 0.4~0.6 | 0.4~0.5 |
| WER[Å/min] | 173.3 | 129.3 | 102.3 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a continuation application of U.S. patent application Ser. No. 17/006,466, filed Aug. 28, 2020 which is based upon and claims the benefit of priority from Japanese Patent Application No. 2019-158563, filed on Aug. 30, 2019, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as an example of processes of manufacturing a semiconductor device, a process of forming an oxide film on a substrate is often carried out by alternately repeating a step of supplying a precursor to the substrate and a step of supplying an oxidizing agent to the substrate.

SUMMARY

The present disclosure provides some embodiments of a technique capable of improving a property of an oxide film formed on a substrate.

According to an embodiment of the present disclosure, there is provided a technique that includes: forming an oxide film containing a central atom X of a precursor on a substrate by performing a cycle a predetermined number of times, the cycle including non-simultaneously performing: (a) forming a first layer containing a component in which a first group is bonded to the central atom X on the substrate by supplying the precursor having a molecular structure in which the first group and a second group are bonded to the central atom X and having a bonding energy between the first group and the central atom X that is higher than a bonding energy between the second group and the central atom X, to the substrate; and (b) forming a second layer containing the central atom X by supplying an oxidizing agent to the substrate to oxidize the first layer, wherein in (a), the precursor is supplied under a condition in which the second group is desorbed and the first group is not desorbed from the central atom X contained in the precursor and the central atom X is adsorbed on a surface of the substrate in a state where the second group is desorbed from the central atom X and the bonding of the first group and the central atom X is maintained.

BRIEF DESCRIPTION OF DRAWINGS

The accompanying drawings, which are incorporated in and constitute a part of the specification, illustrate embodiments of the present disclosure.

FIG. 7 is a diagram illustrating various measurement results of film thicknesses and the like of SiO films in an embodiment and a comparative example.

FIG. 9 is a diagram illustrating measurement results of a film thickness uniformity and a wet etching rate of n SiO film in a plane of a substrate in another embodiment.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An Embodiment of the Present Disclosure

An embodiment of the present disclosure will now be described mainly with reference to FIGS. 1 to 4, and 6A to 6C.

(1) Configuration of the Substrate Processing Apparatus

Figure 1:
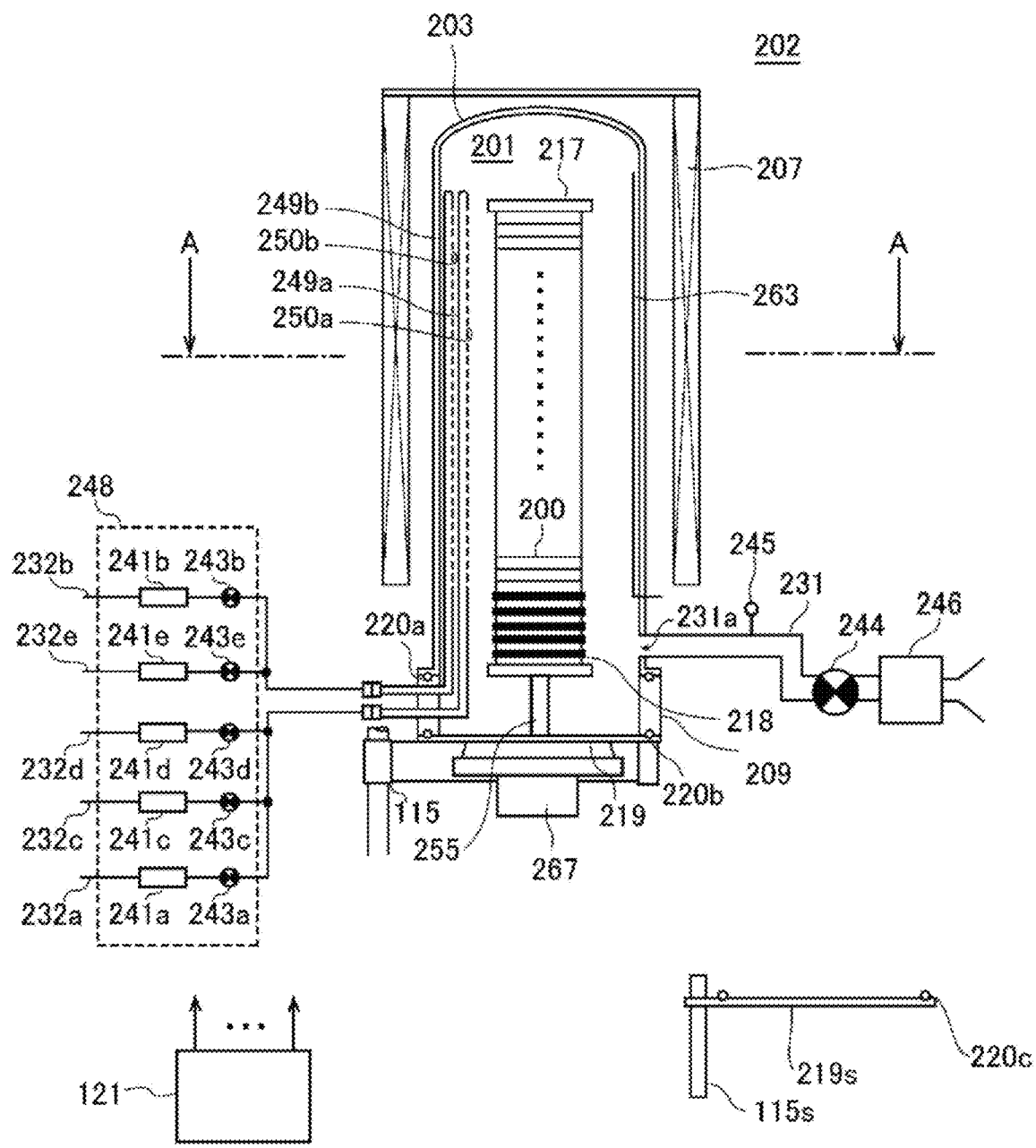
FIG. 1 is a schematic configuration diagram of a vertical type process furnace of a substrate processing apparatus used in an embodiment of the present disclosure, in which a process furnace is shown in a vertical cross-sectional view.

As illustrated in FIG. 1, a process furnace 202 includes a heater 207 as a heating mechanism (temperature adjustment part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The wafers 200 are processed in the process chamber 201.

Nozzles 249a and 249b as first and second supply parts are respectively installed in the process chamber 201 to penetrate a sidewall of the manifold 209. The nozzles 249a and 249b will be referred to as a first nozzle and a second nozzle, respectively. The nozzles 249a and 249b are each made of a non-metallic material which is a heat resistant material such as quartz, SiC or the like. The nozzles 249a and 249b are configured as common nozzles configured to supply a plurality of kinds of gases, respectively.

Gas supply pipes 232a and 232b as first and second pipes are connected to the nozzles 249a and 249b respectively. The gas supply pipes 232a and 232b are configured as common pipes configured to supply a plurality of kinds of gases, respectively. Mass flow controllers (MFCs) 241a and 241b, which are flow rate controllers (flow rate control parts), and valves 243a and 243b, which are opening/closing valves, are installed, in sequence from an upstream side of gas flow, at the gas supply pipes 232a and 232b respectively. Gas supply pipes 232c and 232d are connected to the gas supply pipe 232a at a downstream side of the valve 243a. MFCs 241c and 241d and valves 243c and 243d are installed, in sequence from an upstream side of gas flow, at the gas supply pipes 232c and 232d respectively. A gas supply pipe 232e is connected to the gas supply pipe 232b at a downstream side of the valve 243b. An MFC 241e and a valves 243e are installed, in sequence from an upstream side of gas flow, at the gas supply pipe 232e. The gas supply pipes 232a to 232e are each made of a metal material such as stainless steel (SUS) or the like.

Figure 2:
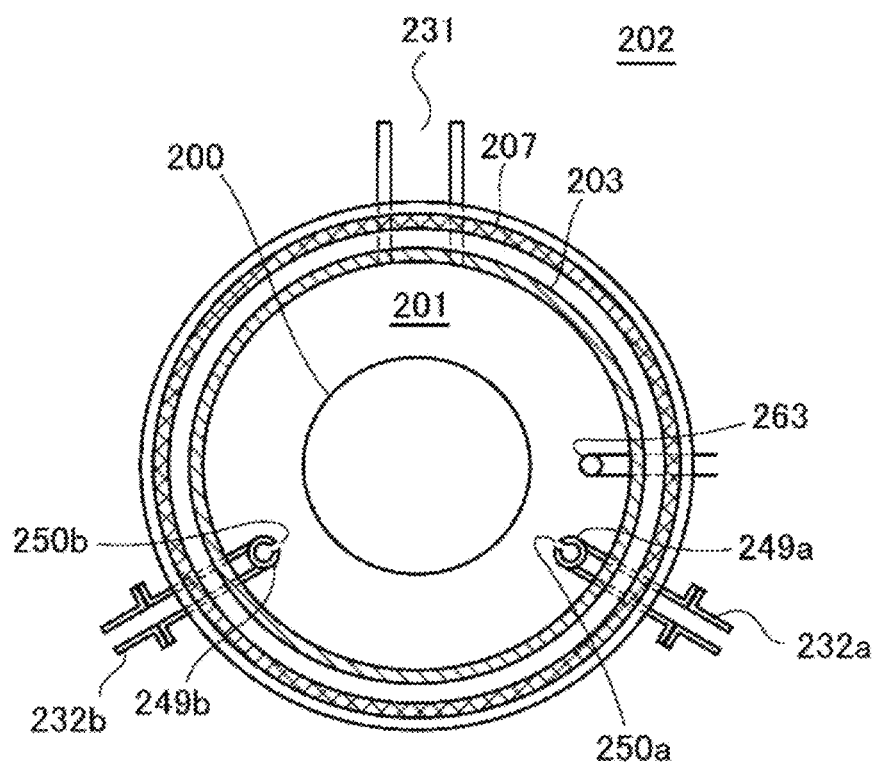
FIG. 2 is a schematic configuration diagram of a vertical type process furnace of a substrate processing apparatus used in an embodiment of the present disclosure, in which a process furnace is shown in a cross-sectional view taken along a line A-A in FIG. 1.

As illustrated in FIG. 2, the nozzles 249a and 249b are disposed in a space, which has an annular shape in a plan view, between an inner wall of the reaction tube 203 and the wafers 200 such that the nozzles 249a and 249b extend upward along an arrangement direction of the wafers 200 from a lower portion to an upper portion of the inner wall of the reaction tube 203. Specifically, the nozzles 249a and 249b are respectively installed at a lateral side of a wafer arrangement region in which the wafers 200 are arranged, namely in a region which horizontally surrounds the wafer arrangement region, to extend along the wafer arrangement region. Gas supply holes 250a and 250b configured to supply a gas are installed on the side surfaces of the nozzles 249a and 249b, respectively. The gas supply holes 250a and 250b are opened toward centers of the wafers 200 in the plan view to allow a gas to be supplied toward the wafers 200. The gas supply holes 250a and 250b may be formed in a plural number between the lower portion to the upper portion of the reaction tube 203.

A precursor (precursor gas) having a molecular structure in which an alkoxy group as a first group and an amino group as a second group are bonded to silicon (Si) as a central atom X is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure.

The alkoxy group has a structure in which an alkyl group (R) as a third group is bonded to an oxygen (O) atom, and is a monovalent functional group represented by a structural formula of —OR. The alkoxy group may include a methoxy group, an ethoxy group, a propoxy group, a butoxy group, and the like. The alkoxy group may be not only these linear alkoxy groups but also branched alkoxy groups such as an isopropoxy group, an isobutoxy group, a secondary butoxy group, a tert-butoxy group and the like. Furthermore, the alkyl group described above may include a methyl group, an ethyl group, a propyl group, a butyl group, and the like. The alkyl group may be not only these linear alkyl groups but also branched alkyl groups such as an isopropyl group, an isobutyl group, a secondary butyl group, a tert-butyl group and the like.

The amino group has a structure in which hydrogen (H) is removed from one of ammonia ($NH_3$), a primary amine and a secondary amine, and is a monovalent functional group represented by a structural formula of one of —$NH_2$, —NHR, and —NRR'. R and R' represented in the structural formulas are alkyl groups including a methyl group, an ethyl group, a propyl group, a butyl group, and the like. R and R' may be not only these linear alkyl groups but also branched alkyl groups such as an isopropyl group, an isobutyl group, a secondary butyl group, a tert-butyl group and the like. R and R' may be the same alkyl group or different alkyl groups.

As the precursor gas, it may possible to use, for example, a gas containing Si as the central atom X, a methoxy group (—OMe) which is an alkoxy group as the first group, and a dimethylamino group (—$N(CH_3)_2$) which is an amino group as the second group, for example, a trimethoxydimethylaminosilane (($CH_3)_2NSi(OCH_3)_3$, abbreviation: TMDMAS) gas. The Si contained in TMDMAS has four bonding hands, in which the methoxy group is bonded to each of three of the four bonding hands of Si, and the dimethylamino group is bonded to the remaining one of the four bonding hands of Si. A ratio of the number of amino groups and the number of alkoxy groups contained in a TMDMAS molecule is set to 1:3. A bonding energy $E_O$ between the methoxy group and Si is higher than a bonding energy $E_A$ between the dimethylamino group and Si. That is, the dimethylamino group has an active characteristic which is more easily desorbed from Si than the methoxy group.

An oxygen (O)-containing gas as an oxidizing agent is supplied from the gas supply pipe 232b into the process chamber 201 via the MFC 241b, the valve 243b, and the nozzle 249b. As the O-containing gas, it may be possible to use, for example, an oxygen ($O_2$) gas. The $O_2$ gas acts as an oxidizing gas, i.e., an O source.

A hydrogen (H)-containing gas is supplied from the gas supply pipe 232c into the process chamber 201 via the MFC 241c, the valve 243c, the gas supply pipe 232a, and the nozzle 249a. The H-containing gas does not cause an oxidation action by itself, but it acts to react with the O-containing gas under specific conditions in substrate processing as described below to generate oxidization species such as atomic oxygen (O), thereby improving an efficiency of oxidizing process. As the H-containing gas, it may be possible to use, for example, a hydrogen ($H_2$) gas.

An inert gas, for example, a nitrogen ($N_2$) gas, is supplied from the gas supply pipes 232d and 232e into the process chamber 201 via the MFCs 241d and 241e, the valves 243d and 243e, the gas supply pipes 232a and 232b, and the nozzles 249a and 249b, respectively. The $N_2$ gas acts as a purge gas, a carrier gas, a dilution gas, or the like.

A precursor supply system mainly includes the gas supply pipe 232a, the MFC 241a, and the valve 243a. An oxidizing agent supply system mainly includes the gas supply pipe 232b, the MFC 241b, and the valve 243b. The gas supply pipe 232c, the MFC 241c and the valve 243c may be regarded as being included in the oxidizing agent supply system. An inert gas supply system mainly includes the gas supply pipes 232d and 232e, the MFCs 241d and 241e, and the valves 243d and 243e.

One or all of various supply systems described above may be configured as an integrated supply system 248 in which the valves 243a to 243e, the MFCs 241a to 241e, and the like are integrated. The integrated supply system 248 is connected to each of the gas supply pipes 232a to 232e such that a supply operation of various kinds of gases into the gas supply pipes 232a to 232e, that is, an opening/closing operation of the valves 243a to 243e, a flow rate adjusting operation by the MFCs 241a to 241e and the like, is controlled by a controller 121, which will be described later. The integrated supply system 248 is configured as an integral type or division type integrated unit, and is also configured to be detachable from the gas supply pipes 232a to 232e and the like on an integrated unit basis such that maintenance, replacement, expansion and the like of the integrated supply system 248 may be performed on the integrated unit basis.

An exhaust port 231a configured to exhaust an internal atmosphere of the process chamber 201 is installed at a lower side of the sidewall of the reaction tube 203. The exhaust port 231a may be installed from the lower portion to the upper portion of the sidewall of the reaction tube 203, that is, along the wafer arrangement region. An exhaust pipe 231 is connected to the exhaust port 231a. The exhaust pipe 231 is made of a metal material such as, e.g., stainless steel (SUS) or the like. A vacuum pump 246 as a vacuum exhaust device is connected to the exhaust pipe 231 via a pressure sensor 245 as a pressure detector (pressure detection part) configured to detect an internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which is made of a metal material such as stainless steel or the like, penetrates the seal cap 219 to be connected to the boat 217. The rotation mechanism 267 is configured to rotate the wafers 200 by rotating the boat 217. The seal cap 219 is configured to be vertically raised or lowered by a boat elevator 115 which is an elevator mechanism installed outside the reaction tube 203. The boat elevator 215 is configured as a transfer system (transfer mechanism) which loads or unloads (transfers) the wafers 200 into or from (out of) the process chamber 201 by moving the seal cap 219 up or down.

A shutter 219s as a furnace opening lid configured to be capable of hermetically sealing the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed at an upper surface of the shutter 219s. An opening/closing operation (an elevating operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
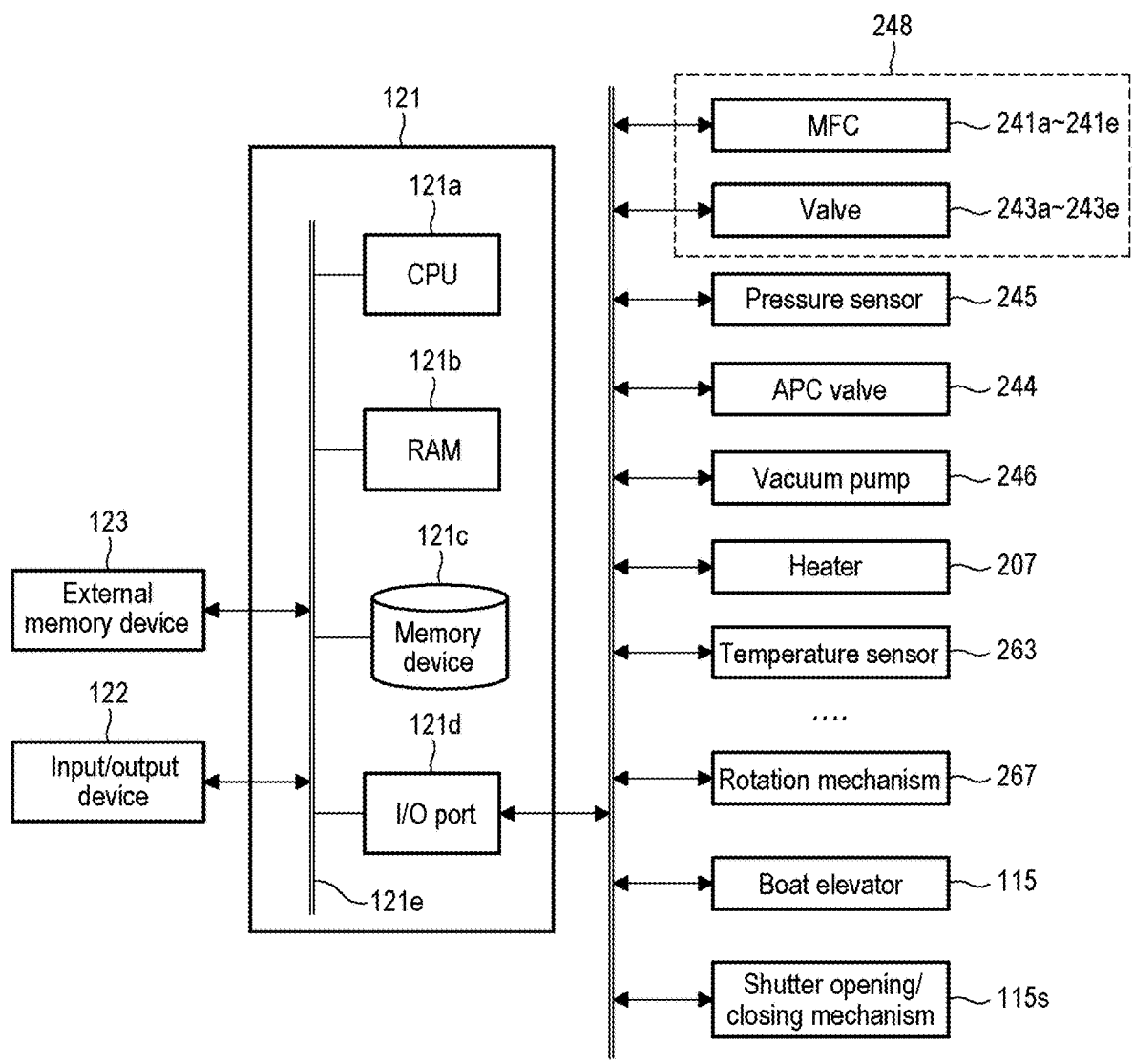
FIG. 3 is a schematic configuration diagram of a controller of a substrate processing apparatus used in an embodiment of the present disclosure, in which a control system of the controller is shown in a block diagram.

As illustrated in FIG. 3, the controller 121, which is a control part (a control means or controller), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 constituted by, for example, a touch panel or the like, is connected to the controller 121.

The memory device 121c includes, for example, a flash memory, a hard disk drive (HDD), and the like. A control program that controls operations of a substrate processing apparatus, a process recipe that specifies sequences and conditions of substrate processing as described below, and the like are readably stored in the memory device 121c. The process recipe functions as a program that causes the controller 121 to execute each sequence in the substrate processing, as described below, to obtain a predetermined result. Hereinafter, the control program, the process recipe and the like will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a is also configured to read the recipe from the memory device 121c according to an input of an operation command and the like from the input/output device 122. In addition, the CPU 121a is configured to control, according to the contents of the recipe thus read, the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 and adjusting the rotation speed of the boat 217 by the rotation mechanism 267, the operation of raising or lowering the boat 217 by the boat elevator 115, the operation of opening and closing the shutter 219s by the shutter opening/closing mechanism 115s, and the like. The controller 121 may be configured by installing, on the computer, the aforementioned program stored in an external memory device 123. The external memory device 123 may include, for example, a magnetic disc such as an HDD, an optical disc such as a CD, a magneto-optical disc such as a MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A substrate processing sequence example of forming an oxide film on a wafer 200 as a substrate using the aforementioned substrate processing apparatus, which is one of the processes for manufacturing a semiconductor device, will be described mainly with reference to FIGS. 4 and 6A to 6C. In the following descriptions, the operations of the respective parts constituting the substrate processing apparatus are controlled by the controller 121.

In the substrate processing sequence according to the present embodiment, an oxide film containing Si, that is, a silicon oxide film (SiO film) containing Si and O, is formed on a wafer 200 by performing a cycle a predetermined number of times (n times, where n is an integer of 1 or more), the cycle including non-simultaneously performing: step A of forming a first layer containing a component in which a methoxy group is bonded to Si on the wafer 200 by supplying a TMDMAS gas as a precursor to the wafer 200; and step B of forming a second layer containing Si by supplying an $O_2$ gas as an oxidizing agent to the wafer 200 to oxidize the first layer.

At step A, the TMDMAS gas is supplied under conditions in which a dimethylamino group is desorbed from Si contained in the TMDMAS while the methoxy group is not desorbed from the Si, and the Si in a state where the dimethylamino group is desorbed and the bond with the methoxy group is maintained is adsorbed on a surface of the wafer 200.

In the present disclosure, for the sake of convenience, a gas supply sequence illustrated in FIG. 4 may sometimes be denoted as follows. The same denotation will be used in the modifications and other embodiments as described below.

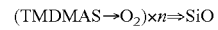

When the term "wafer" is used herein, it may refer to a wafer itself or a laminated body of a wafer and a predetermined layer or film formed on a surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

If a plurality of wafers 200 is charged on the boat 217 (wafer charging), the shutter 219s may be moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, namely a space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information (pressure regulation). Furthermore, the wafers 200 in the process chamber 201 are heated by the heater 207 to a desired temperature. In this operation, a degree of supplying electric power to the heater 207 is feedback-controlled based on the temperature information detected by the temperature sensor 263 such that the interior of the process chamber 201 has a desired temperature distribution (temperature adjustment). In addition, the rotation of the boat 217 and the wafers 200 by the rotation mechanism 267 begins. The driving of the vacuum pump 246 and the heating and rotation of the wafers 200 may be all continuously performed at least until the processing of the wafers 200 is completed.

Figure 6A:
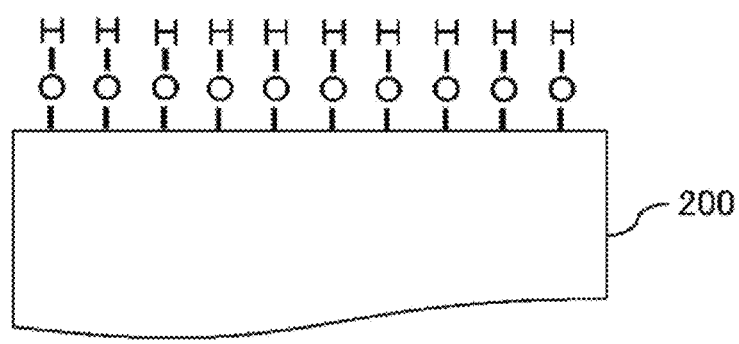
FIG. 6A is a diagram schematically illustrating a surface state of a substrate before a film-forming step starts.

As illustrated in FIG. 6A, the surface of the wafer 200 is terminated with a hydroxy group (—OH) (OH-terminated). The OH termination existing on the surface of the wafer 200 functions as an adsorption site of molecules or atoms.

(Film-Forming Step)

Subsequently, the following steps A and B are sequentially performed.

[Step A]

At this step, a TMDMAS gas is supplied to the wafer 200 in the process chamber 201 (TMDMAS gas supply). Specifically, the valve 243a is opened to allow a TMDMAS gas to flow through the gas supply pipe 232a. The flow rate of the TMDMAS gas is adjusted by the MFC 241a. The TMDMAS gas is supplied into the process chamber 201 via the nozzle 249a and is exhausted from the exhaust port 231a. At this time, the TMDMAS gas is supplied to the wafer 200. Simultaneously, the valves 243d and 243e may be opened to supply a $N_2$ gas into the process chamber 201 via the nozzles 249a and 249b.

By performing this step under processing conditions described below, a dimethylamino group ($NMe_2$) can be desorbed from Si contained in the TMDMAS gas while a methoxy group (OMe) is not desorbed from the Si. Furthermore, the Si in a state where the dimethylamino group is desorbed and the bond with the methoxy group is maintained can be adsorbed (chemisorbed) on the surface of the wafer 200. That is, the Si can be adsorbed on a portion of the adsorption site on the surface of the wafer 200 in a state where the methoxy group is bonded to each of three of four bonding hands of the Si. In this manner, a first layer containing a component in which the methoxy group is bonded to the Si can be formed on the outermost surface of the wafer 200.

In addition, by performing this step under processing conditions as described below, the dimethylamino group desorbed from the Si contained in the TMDMAS gas can be prevented from being adsorbed on the surface of the wafer 200. As a result, it is possible to prevent the dimethylamino group desorbed from the Si contained in the TMDMAS gas from being contained in the first layer formed on the wafer 200. That is, it is possible to allow the first layer formed on the wafer 200 to become a layer having a small amount of impurity such as C, N or the like.

At this step, since the methoxy group is bonded to the Si adsorbed on the surface of the wafer 200, that is, the three bonding hands of the Si adsorbed on the surface of the wafer 200 are filled with the methoxy group, it becomes possible to inhibit adsorption of atoms or molecules to the Si adsorbed on the surface of the wafer 200. Further, at this step, the methoxy group bonded to Si adsorbed on the surface of the wafer 200 is allowed to act as a steric hindrance, to inhibit the adsorption of atoms or molecules to the adsorption site (OH termination) on the surface of the wafer 200 around the Si adsorbed on the surface of the wafer 200. In addition, at this step, it becomes possible to hold the adsorption site (OH termination) on the surface of the wafer 200 around the Si adsorbed on the surface of the wafer 200 accordingly.

At this step, the TMDMAS gas may be supplied continuously until an adsorption reaction (chemisorption reaction) of Si on the surface of the wafer 200 is saturated. Even if the TMDMAS gas is continuously supplied in this way, the Si can be discontinuously adsorbed on the surface of the wafer 200 because the methoxy group bonded to the Si acts as the steric hindrance. Specifically, the Si can be adsorbed on the surface of the wafer 200 such that a layer made of the Si has a thickness of less than one atomic layer.

Figure 6B:
FIG. 6B is a diagram schematically illustrating a surface state of the substrate when step A is performed.
Figure 6B:
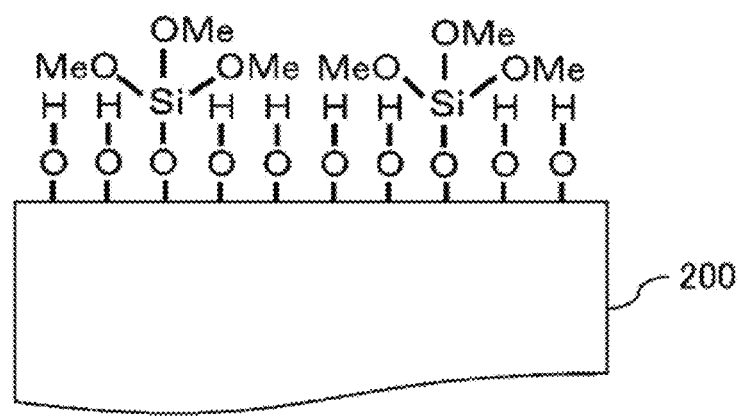

As illustrated in FIG. 6B, in a state in which the adsorption reaction of Si on the surface of the wafer 200 is saturated, the surface of the wafer 200 is covered with the methoxy group bonded to Si (that is to say, a plural number of molecules of the methoxy group bonded to Si, i.e., the first group), and a portion of the surface of the wafer 200 is held without consuming the adsorption site (OH termination). In the state in which the adsorption reaction of Si on the surface of the wafer 200 is saturated, the layer made of the Si adsorbed on the surface of the wafer 200 becomes a discontinuous layer having a thickness of less than one atomic layer.

After the first layer is formed, the valve 243a is closed to stop the supply of the TMDMAS gas into the process chamber 201. Then, the interior of the process chamber 201 is vacuum-exhausted, and the gas and the like remaining within the process chamber 201 is removed from the interior of the process chamber 201 (purge). At this time, the valves 243d and 243e are opened to supply a $N_2$ gas into the process chamber 201. The $N_2$ gas acts as a purge gas.

As the precursor gas, it may be possible to appropriately use, without being limited to the TMDMAS gas, various gases having the same structure, that is having a molecular structure in which the first group and the second group are bonded to the Si as the central atom, as long as they are gases in which a bonding energy $E_O$ of the first group and Si is higher than a bonding energy $E_N$ of the second group and Si. That is, as the precursor gas, it may be possible to appropriately use various gases having the molecular structure in which the first group and the second group are bonded to the Si as the central atom. The gases may contain an alkoxy group as the first group and contain at least one selected from the group of an amino group, an alkyl group, a halogeno group, a hydroxy group, a hydro group, an aryl group, a vinyl group, and a nitro group as the second group, as the gases. The alkyl group herein may include a methyl group, an ethyl group, a propyl group, a butyl group, and the like. Further, the halogeno group may include a chloro group, a fluoro group, a bromo group, an iodo group, and the like. That is, the halogeno group may contain a halogen element such as chlorine (Cl), fluorine (F), bromine (Br), iodine (I) or the like.

As the inert gas, it may be possible to use, in addition to the $N_2$ gas, a rare gas such as a Ar gas, a He gas, a Ne gas, a Xe gas or the like. This also applies to step B as described below.

[Step B]

After step A is completed, an $O_2$ gas is supplied to the wafer 200 in the process chamber 201, that is, the first layer formed on the wafer 200 ($O_2$ gas supply). Specifically, the valve 243b is opened to allow the $O_2$ gas to flow through the gas supply pipe 232b. A flow rate of the $O_2$ gas is adjusted by the MFC 241b. The $O_2$ gas is supplied into the process chamber 201 via the nozzle 249b and is exhausted from the exhaust port 231a. At this time, the $O_2$ gas is supplied to the wafer 200. At this time, the valves 243d and 243e may be opened to supply a $N_2$ gas into the process chamber 201 via the nozzles 249a and 249b.

Figure 6C:
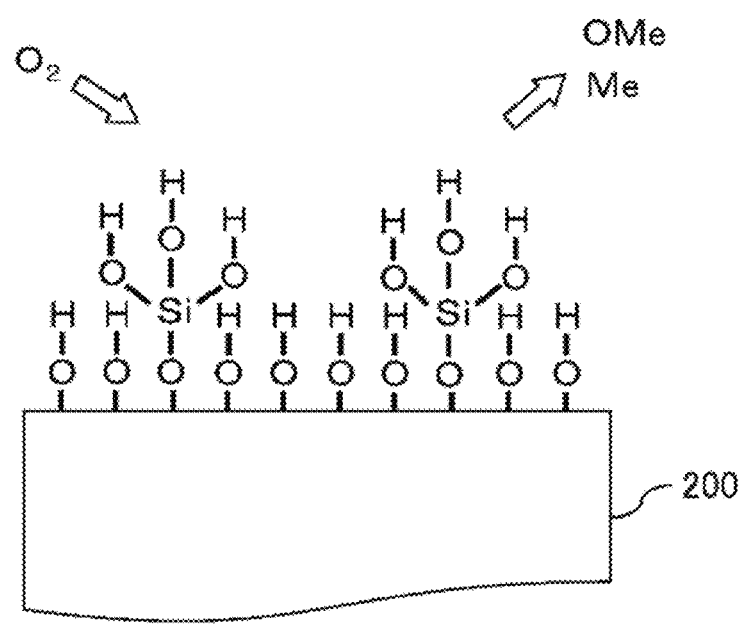
FIG. 6C is a diagram schematically illustrating a surface state of the substrate when step B is performed.

By performing this step under processing conditions as described below, at least one of the methyl group (Me) contained in the methoxy group (OMe) bonded to the Si contained in the first layer and the methoxy group (OMe) bonded to the Si can be desorbed from the first layer. Then, at least a portion of the first layer formed on the wafer 200 can be oxidized (modified) to form a silicon oxide layer (SiO layer) which is a layer containing Si and O as a second layer. As illustrated in FIG. 6C, the second layer becomes a layer containing no methyl group or methoxy group, that is, a layer containing no impurity such as C or the like. In addition, as a result of the oxidizing process with the $O_2$ gas, a surface of the second layer is in a OH-terminated state. Further, the impurity such as C or the like desorbed from the first layer constitutes a gaseous substance such as carbon dioxide ($CO_2$) or the like and is discharged from the interior of the process chamber 201.

After the second layer is formed, the valve 243b is closed to stop the supply of the $O_2$ gas into the process chamber 201. Then, the gas or the like, which remains within the process chamber 201, is removed from the interior of the process chamber 201 according to the same processing procedure as that of the purge at step A (purge). As the oxidizing agent, it may be possible to use, in addition to the $O_2$ gas, for example, an O-containing gas, for example, a plasma-exited $O_2$ gas ($O_2^*$), an ozone ($O_3$) gas, an $O_2+H_2$ gas, water vapor ($H_2O$ gas), a nitric oxide (NO) gas, a nitrous oxide ($N_2O$) gas or the like.

[Performing a Predetermined Number of Times]

A cycle which non-simultaneously, i.e., non-synchronously, performs steps A and B described above is implemented a predetermined number of times (n times, where n is an integer of 1 or more), whereby a SiO film having a predetermined composition and a predetermined thickness can be formed on the wafer 200. The aforementioned cycle may be repeated multiple times. That is, the aforementioned cycle may be repeated multiple times until the thickness of the SiO film formed by setting a thickness of the second layer formed by performing the aforementioned cycle once smaller than a desired thickness and laminating the second layer becomes equal to the desired thickness.

The processing conditions at step A may be exemplified as follows:

TMDMAS gas supply flow rate: 0.01 to 2 slm, specifically 0.1 to 1 slm in some embodiments $N_2$ gas supply flow rate (per gas supply pipe): 0 to 10 slm Supply time of each gas: 1 to 120 seconds, specifically 1 to 60 seconds in some embodiments Processing temperature (temperature of wafer 200): 550 to 700 degrees C., specifically 600 to 650 degrees C. in some embodiments Processing pressure (internal pressure of process chamber 201): 1 to 2,666 Pa, specifically 67 to 1,333 Pa in some embodiments.

The processing conditions at step B may be exemplified as follows:

$O_2$ gas supply flow rate: 0.01 to 10 slm

Supply time of $O_2$ gas: 1 to 120 seconds, specifically 1 to 60 seconds in some embodiments Processing pressure: 1 to 4,000 Pa, specifically 1 to 3,000 Pa in some embodiments.

Other processing conditions may be similar to those of step A.

In the present disclosure, an expression of a numerical range such as "1 to 2,666 Pa" may mean that a lower limit value and an upper limit value are included in that range. Therefore, for example, "1 to 2,666 Pa" may mean "1 Pa or higher and 2,666 Pa or lower." The same applies to other numerical ranges.

If the processing temperature is lower than 550 degrees C., at step A, there may be a case where the dimethylamino group desorbed from the Si contained in the TMDMAS gas is adsorbed on the surface of the wafer 200. Further, at step B, there may be a case where it is difficult to desorb at least one of the methyl group contained in the methoxy group bonded to the Si contained in the first layer and the methoxy group bonded to the Si from the first layer. As a result, an impurity such as C, N or the like derived from the dimethylamino group or the methoxy group may easily remain in the SiO film formed on the wafer 200, lowering a processing resistance (wet etching resistance or the like) of the SiO film formed on the wafer 200.

By setting the processing temperature at a temperature of 550 degrees C. or higher, at step A, it is possible to prevent the dimethylamino group desorbed from the Si contained in the TMDMAS gas from being adsorbed on the surface of the wafer 200. Further, at step B, it is possible to promote the desorption of at least one of the methyl group contained in the methoxy group bonded to the Si contained in the first layer and the methoxy group bonded to the Si, from the first layer. As a result, it is possible to improve the processing resistance of the SiO film formed on the wafer 200. By setting the processing temperature at a temperature of 600 degrees C. or higher, it is possible to further enhance the aforementioned effects and to further improve the processing resistance of the SiO film formed on the wafer 200.

Further, if the processing temperature exceeds 700 degrees C., at step A, there may be a case where the TMDMAS gas is likely to be pyrolyzed, which makes it difficult for the Si in the state where the dimethylamino group is desorbed and the bond with the methoxy group is maintained to be adsorbed on the surface of the wafer 200. As a result, it becomes difficult for each of the aforementioned actions by the methoxy group bonded to the Si to occur, making it difficult to allow the layer made of the Si adsorbed on the surface of the wafer 200 to become a discontinuous layer having a thickness of less than one atomic layer. Thus, a film thickness uniformity and a step coverage of the SiO film formed on the wafer 200 in the plane of the wafer may be deteriorated.

By setting the processing temperature at a temperature of 700 degrees C. or lower, at step A, it is possible to suppress pyrolysis of the TMDMAS gas and to adsorb the Si in the state where the dimethylamino group is desorbed and the bond with the methoxy group is maintained on the surface of the wafer 200. As a result, each of the aforementioned actions by the methoxy group bonded to Si can occur to allow the layer made of the Si adsorbed on the surface of the wafer 200 to become a discontinuous layer having a thickness of less than one atomic layer. Thus, it is possible to improve the film thickness uniformity and the step coverage of the SiO film formed on the wafer 200 in the plane of the wafer. By setting the processing temperature at a temperature of 650 degrees C. or lower, it is possible to further enhance the aforementioned effects and to improve the film thickness uniformity and the step coverage of the SiO film formed on the wafer 200 in the plane of the wafer.

(After-Purge and Atmospheric Pressure Return)

After the formation of the SiO film on the wafer 200 is completed, the $N_2$ gas as a purge gas is supplied from each of the nozzles 249a and 249b into the process chamber 201 and is exhausted from the exhaust port 231a. Thus, the interior of the process chamber 201 is purged and the gas or reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.

(a) By desorbing the dimethylamino group from the Si contained in TMDMAS while the methoxy group is not desorbed from the Si, and adsorbing the Si in the state where the dimethylamino group is desorbed and the bond with the methoxy group is maintained on the surface of the wafer 200 at step A, it is possible to inhibit the adsorption of atoms or molecules to Si adsorbed on the surface of the wafer 200 and to the adsorption site on the surface of the wafer 200 around Si, by the action of the methoxy group bonded to the Si. This makes it possible to allow the layer made of the Si adsorbed on the surface of the wafer 200 to become a discontinuous layer having a thickness of less than one atomic layer. In addition, it is thus possible to improve the film thickness uniformity and the step coverage of the SiO film formed on the wafer 200 in the plane of the wafer and to allow this film to become a conformal film. Further, for example, in a case where a gas, in which an amino group is bonded to the central atom Si and an alkoxy group is not bonded thereto, such as a tris-dimethylaminosilane ($Si[N(CH_3)_2]_3H$, abbreviation: 3DMAS) gas, is used as the precursor gas, the action by the alkoxy group (methoxy group) in the present embodiment does not occur, and therefore the film thickness uniformity and the step coverage of the SiO film formed on the wafer 200 in the plane of the wafer may be deteriorated.

(b) By preventing the dimethylamino group desorbed from the Si contained in the TMDMAS gas from being adsorbed on the surface of the wafer 200 at step A, it is possible to allow the first layer to become a layer having a small amount of impurity such as C, N or the like. This makes it possible to allow the SiO film formed on the wafer 200 to become a film having excellent processing resistance.

(c) By desorbing at least one of the methyl group contained in the methoxy group bonded to the Si contained in the first layer and the methoxy group bonded to the Si at step B, it is possible to allow the second to become a layer having a small amount of impurity such as C or the like. This makes it possible to allow the SiO film formed on the wafer 200 to become a film having excellent processing resistance.

(d) By using a thermally excited $O_2$ gas, that is, an $O_2$ gas in a plasma non-excited state as the oxidizing agent at step B, that is, by performing the film-forming step in a non-plasma atmosphere, it is possible to avoid plasma damage to the SiO film formed on the wafer 200. In addition, it is possible to avoid plasma damage to members or the like in the process chamber 201. Further, since the oxidizing process can be performed while suppressing an oxidizing power, it is possible to suppress oxidation of a base (the surface of the wafer 200) when forming the SiO film.

(e) The effects according to the present embodiment can be similarly achieved in q case where a precursor other than the TMDMAS gas is used, in a case where an oxidizing agent other than the $O_2$ gas is used, or in a case where an inert gas other than the $N_2$ gas is used.

(4) Exemplary Modifications

The substrate processing sequence of the present embodiment may be modified as in the modifications described below.

(Modification 1)

As in a gas supply sequence described below, at a film-forming step, a cycle which sequentially and non-simultaneously performs step A and step B after supplying (pre-flowing) an $O_2$ gas to the wafer 200 in advance may be implemented a predetermined number of times (n times, where n is an integer of 1 or more).

$O_2 \rightarrow (TMDMAS \rightarrow O_2) \times n \Rightarrow SiO$

According to this modification, the same effects as those of the aforementioned embodiments may be achieved. Further, by pre-flowing the $O_2$ gas to the wafer 200, it is possible to optimize the adsorption site (OH termination) on the surface of the wafer 200 before performing step A. Thus, it is possible to promote the formation of the first layer at step A and to shorten the incubation time when forming the SiO film.

(Modification 2)

Figure 5:
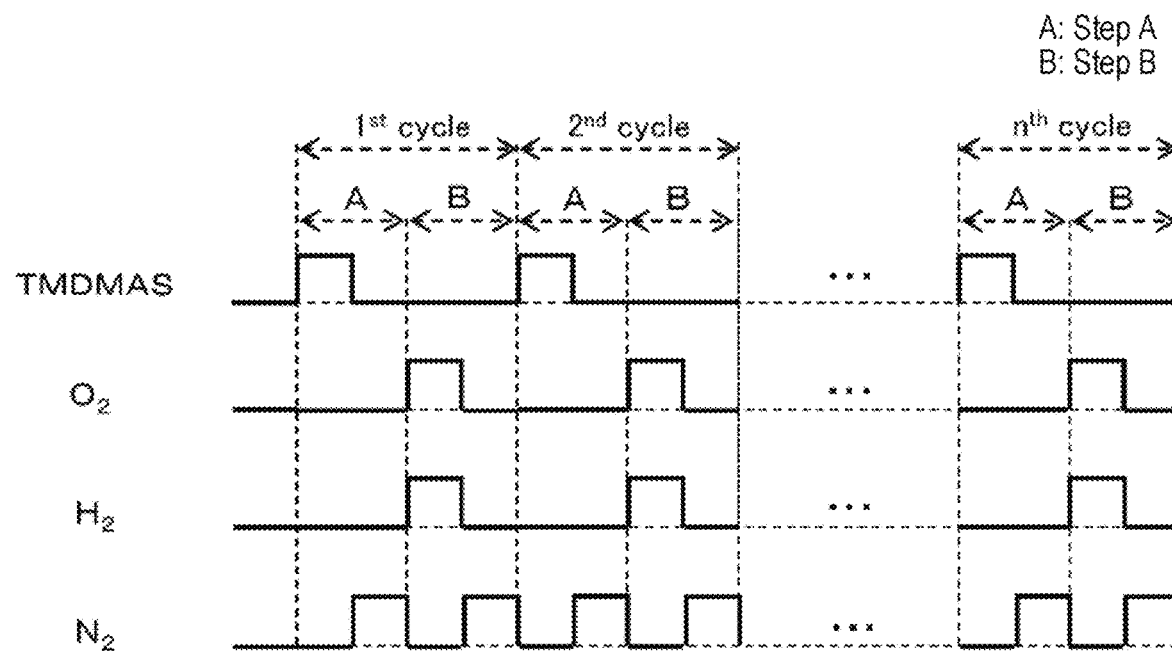
FIG. 5 is a diagram illustrating an exemplary modification of a gas supply sequence according to an embodiment of the present disclosure.

As in FIG. 5 and the gas supply sequence illustrated below, at step B, an $O_2$ gas+$H_2$ gas may be used as the oxidizing agent.

$(TMDMAS \rightarrow O_2 + H_2) \times n \Rightarrow SiO$

Specifically, at step B, the valves 243b and 243c are opened to allow an $O_2$ gas and a $H_2$ gas to flow through the gas supply pipes 232b and 232c respectively. Flow rates of the $O_2$ gas and the $H_2$ gas flowing through the gas supply pipes 232b and 232c are adjusted by the MFCs 241b and 241c, respectively. The $O_2$ gas and the $H_2$ gas are supplied into the process chamber 201 via the nozzles 249b and 249a. The $O_2$ gas and the $H_2$ gas are mixed and reacted in the process chamber 201 and is subsequently exhausted from the exhaust port 231a. At this time, water ($H_2O$)-free oxidization species containing oxygen such as atomic oxygen (O) or the like generated by the reaction between the $O_2$ gas and the $H_2$ gas are supplied to the wafer 200.

The processing conditions at this step may be exemplified as follows:

$O_2$ gas supply flow rate: 0.1 to 10 slm $H_2$ gas supply flow rate: 0.1 to 10 slm Gas supply time: 1 to 120 seconds, specifically 1 to 60 seconds in some embodiments Processing pressure: 1 to 3,000 Pa, specifically 1 to 2,000 Pa in some embodiments.

Other processing conditions may be similar to the processing conditions of step A.

According to this modification, the same effects as those of the aforementioned embodiments may be achieved. Further, according to this modification, at step B, it is possible to further promote the desorption of at least one of the methyl group contained in the methoxy group bonded to the Si contained in the first layer and the methoxy group bonded to the Si by the strong oxidizing power of the oxidization species such as atomic oxygen or the like. As a result, it is possible to further improve the processing resistance of the SiO film formed on the wafer 200.

Other Embodiments of the Present Disclosure

While the embodiments of the present disclosure have been specifically described above, the present disclosure is not limited to the aforementioned embodiments but may be variously modified without departing from the spirit of the present disclosure.

As in gas supply sequences illustrated below, a plasma-excited $O_2$ gas ($O_2^*$) or an $O_3$ gas may be used as the oxidizing agent. Processing procedures and processing conditions in a case where these oxidizing agents are supplied may be similar to those at step B of the aforementioned embodiments.

$(TMDMAS \rightarrow O_2^*) \times n \Rightarrow SiO$ $(TMDMAS \rightarrow O_3) \times n \Rightarrow SiO$ Even in these cases, the same effects as those of the aforementioned embodiments may be achieved. Further, at step B, it is possible to further promote the desorption of at least one of the methyl group contained in the methoxy group bonded to the Si contained in the first layer and the methoxy group bonded to the Si by a strong oxidizing power exerted by these oxidizing agents. As a result, it is possible to further improve the processing resistance of the SiO film formed on the wafer 200.

Further, as in the gas supply sequences (where n, n1 and n2 are integers of 1 or more) illustrated below, as the precursor gas, it may be possible to use, in addition to the TMDMAS gas, a gas containing halogen (Cl) and Si, such as a hexachlorodisilane ($Si_2Cl_6$, abbreviation: HCDS) gas which is a halosilane-based gas (chlorosilane-based bas). Processing procedures and processing conditions when supplying the HCDS gas may be similar to those at step A of the aforementioned embodiments. Instead of the HCDS gas, a tetrachlorosilane ($SiCl_4$) gas, a trichlorosilane ($SiHCl_3$) gas, a dichlorosilane ($SiH_2Cl_2$) gas, a monochlorosilane ($SiH_3Cl$) gas, or the like may be used.

(HCDS→TMDMAS→$O_2$)×n⇒SiO

(TMDMAS→HCDS→$O_2$)×n⇒SiO

[(HCDS→TMDMAS)×$n_1$→$O_2$]×$n_2$⇒SiO

[(TMDMAS→HCDS)×$n_1$→$O_2$]×$n_2$⇒SiO

(HCDS→TMDMAS→$O_2$+$H_2$)×n⇒SiO

(TMDMAS→HCDS→$O_2$+$H_2$)×n⇒SiO

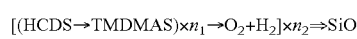

[(HCDS→TMDMAS)×$n_1$→$O_2$+$H_2$]×$n_2$⇒SiO

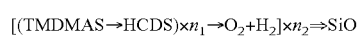

[(TMDMAS→HCDS)×$n_1$→$O_2$+$H_2$]×$n_2$⇒SiO

Even in these cases, the same effects as those of the aforementioned embodiments may be achieved. Further, it is also possible to increase a deposition rate by using a plurality of kinds of precursor gases. In addition, adjustment of the composition is possible, such as increasing an Si concentration in the SiO film.

The central atom X contained in the precursor gas may be a metal element such as aluminum (Al), titanium (Ti), zirconium (Zr), hafnium (Hf) or the like. In these cases, a metal oxide film such as an aluminum oxide film (AlO) film, a titanium oxide film (TiO film), a zirconium oxide film (ZrO film), a hafnium oxide film (HfO film) or the like may be formed on the wafer 200. Processing procedures and processing conditions in these cases may be similar to those of the aforementioned embodiments. Even in these cases, the same effects as those of the aforementioned embodiments may be achieved.

Recipes used in each processing may be provided individually according to the processing contents and may be stored in the memory device 121*c* via a telecommunication line or the external memory device 123. Moreover, at the start of each processing, the CPU 121*a* may properly select an appropriate recipe from the recipes stored in the memory device 121*c* according to the processing contents. Thus, it is possible for a single substrate processing apparatus to form films of different kinds, composition ratios, qualities and thicknesses with enhanced reproducibility. In addition, it is possible to reduce an operator's burden and to quickly start each processing while avoiding an operation error.

The recipes described above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which films are formed using a batch-type substrate processing apparatus capable of processing a plurality of substrates at a time. The present disclosure is not limited to the aforementioned embodiments but may be appropriately applied to, for example, a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, each processing may be performed by processing procedures and processing conditions similar to those of the aforementioned embodiments. Effects similar to those of the aforementioned embodiments may be achieved.

The embodiments described above may be appropriately combined with one another. Processing procedures and processing conditions at this time may be similar to, for example, the processing procedures and processing conditions of the aforementioned embodiments.

EXAMPLES

Figure 4:
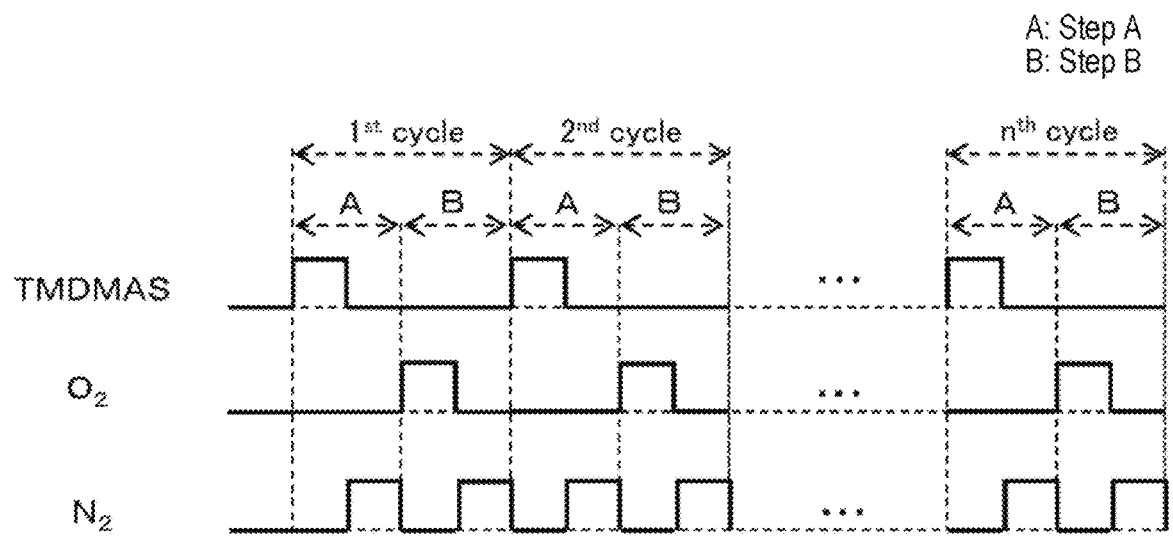
FIG. 4 is a diagram illustrating a gas supply sequence according to an embodiment of the present disclosure.

In an example, an SiO film was formed on a wafer using the substrate processing apparatus illustrated in FIG. 1 and by the film-forming sequence illustrated in FIG. 4. Further, in a comparative example, an SiO film was formed on a wafer by alternately repeating a step of supplying an HCDS gas and a step of supplying an $O_2$+$H_2$ gas using the substrate processing apparatus illustrated in FIG. 1. As the wafer, a bare wafer (w/o PTN) having no uneven pattern is formed on its surface and a patterned wafer having an uneven pattern formed on its surface were used. For the patterned wafer, when a surface area of the bare wafer is 1, a wafer having a surface area 10 times, a wafer having a surface area 23 times (w/×23 PTN), and a wafer having a surface area 50 times (W/×50 PTN) the surface area of the bare wafer were used, respectively. In both the example and the comparative example, processing conditions at each step were set to predetermined conditions which fall within a range of the processing conditions described in the aforementioned embodiments.

Then, in the example and the comparative example, an average film thickness [Å] of the SiO film formed on the bare wafer in the plane of the wafer, a film thickness uniformity (WiW) [±%] in the plane of the wafer, and an inter-wafer film thickness uniformity (WtW) [±%], a refractive index (R.I.), a density [g/cm³], a surface roughness RMS [nm], a surface roughness Rmax [nm], and an oxidation thickness of the wafer surface (base oxidation thickness) [Å] were each measured. The results are shown in FIG.

7. Top, Cen, and Btm in FIG. 7 indicate positions of wafers to be measured in the vertical direction, and indicate a top portion, a central portion, and a bottom portion in the wafer arrangement region, respectively. As shown in FIG. 7, it can be seen that the SiO film of the example has smaller WiW and WtW, that is, more excellent film thickness uniformity in the plane of the wafer and the inter-wafer film thickness uniformity, than the SiO film of the comparative example. Further, it can be seen that the SiO film of the example has smaller RMS and Rmax, that is, a smoother surface (excellent surface roughness), than the SiO film of the comparative example. Further, it is understood that the base oxidation thickness of the example is ½ or less of the base oxidation thickness of the comparative example, indicating that a base oxidation can be suppressed more in the example than in the comparative example. It can be seen that the R.I. and the density of the SiO film of the example and the R.I. and the density of the SiO film of the comparative example are approximately equal respectively.

Figure 8A:
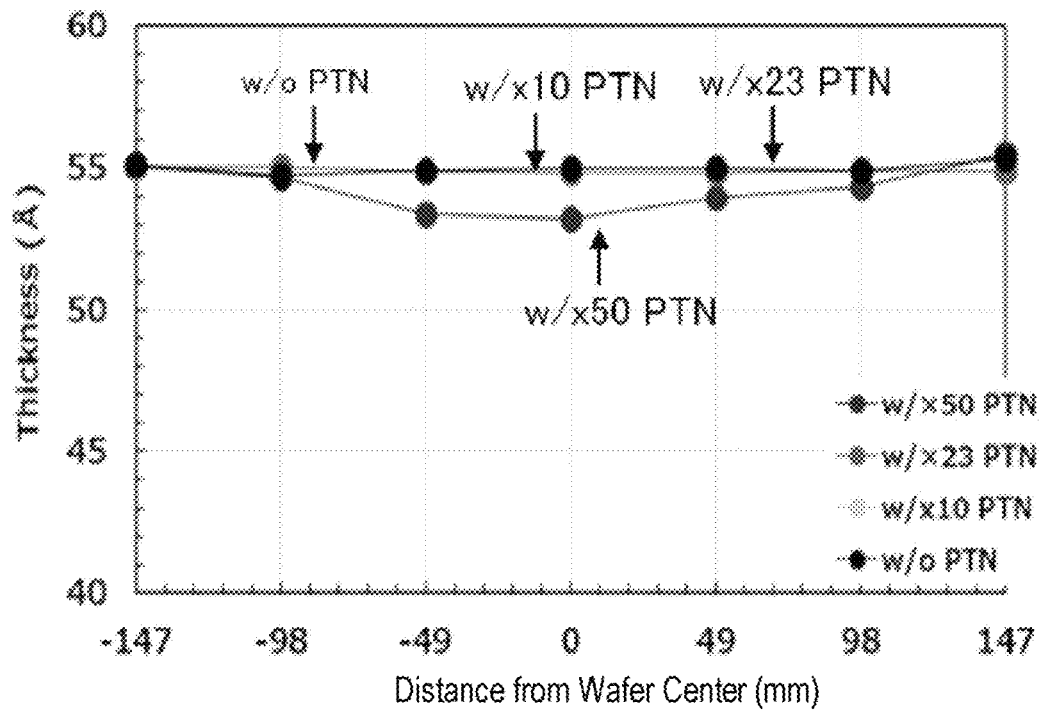
FIG. 8A is a diagram illustrating a measurement result of a film thickness distribution of a SiO film in a plane of a substrate in an embodiment.
Figure 8B:
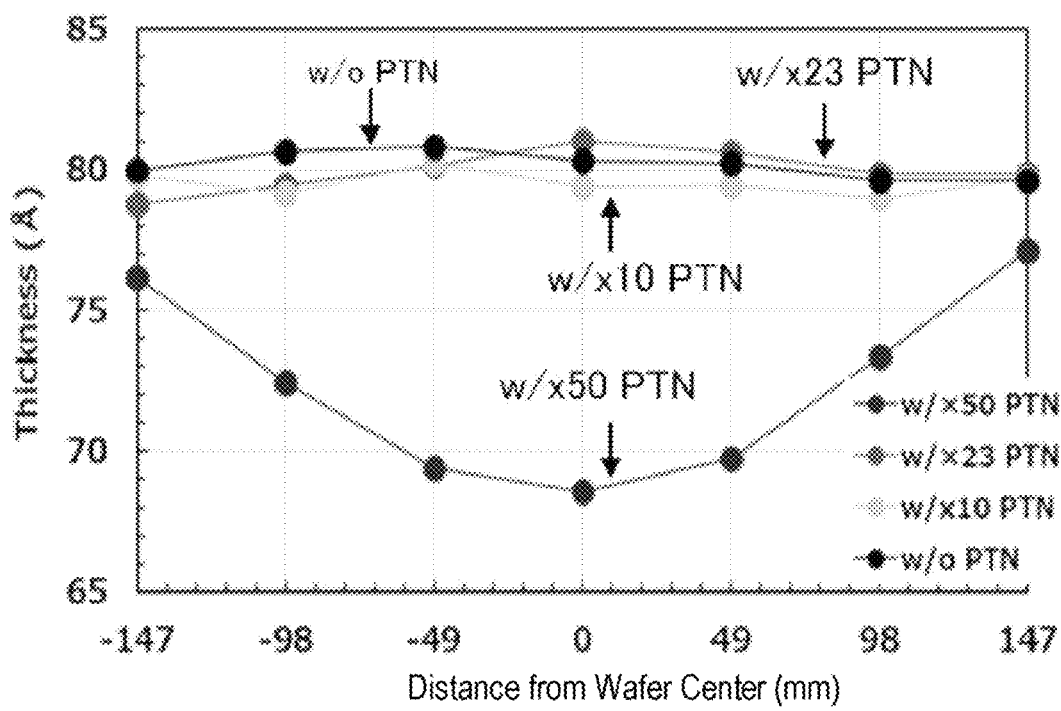
FIG. 8B is a diagram illustrating a measurement result of a film thickness distribution of n SiO film in a plane of a substrate in a comparative example.

Furthermore, in the example and the comparative example, the film thickness distributions of the SiO films formed on the wafers in the planes of the wafers were each measured. FIG. 8A shows a measurement result of the example, and FIG. 8B shows a measurement result of the comparative example. In either drawing, a horizontal axis indicates a distance (mm) from a center of the wafer, and a vertical axis indicates a thickness (Å) of the SiO film. According to these drawings, it can be seen that the film thickness distribution of the SiO film in the plane of the wafer of the comparative example has a strong tendency that, as the surface area of the wafer increases, the thickness becomes the smallest in the central portion of the wafer and becomes larger gradually toward a peripheral portion of the wafer (a central recess distribution). In contrast, it can be seen that the film thickness distribution of the SiO film in the plane of the wafer of the example is unlikely to have the central recess distribution even when the surface area of the wafer is increased.

Further, in the example and the comparative example, as a result of examining compositions of the SiO films formed on the wafers, it was found that the SiO film of the comparative example contains Cl, whereas the SiO film of the example does not contain Cl. It was also found that a C concentration in the SiO film of the example is as low as a C concentration in the SiO film of the comparative example.

In another example, an SiO film was formed on a wafer using the substrate processing apparatus illustrated in FIG. 1 and by the film-forming sequence illustrated in FIG. 4. Processing temperatures were set to 500, 600, and 650 degrees C. Other processing conditions were set to predetermined conditions which fall within the range of the processing conditions described in the aforementioned embodiments. Then, WiW [±%] of the SiO film formed on the wafer and a wet etching rate (WER) [Å/min] of the SiO film when etched using a 1% hydrogen fluoride (HF) aqueous solution were each measured. Results of the measurement are shown in FIG. 9. From FIG. 9, it can be seen that the WiW of the SiO film becomes smaller by increasing the processing temperature, that is, the film thickness uniformity in the plane of the wafer becomes better. Further, it can be seen that the WER of the SiO film becomes smaller by increasing the processing temperature, that is, the processing resistance is improved. Further, it can be seen from FIG. 9 that, by setting the processing temperature to 600 degrees C. or higher, the film thickness uniformity of the SiO film in the plane of the wafer and the processing resistance are sharply improved. It was also confirmed that these characteristics were sharply improved even when the processing temperature was set to 550 degrees C. or higher.

According to the present disclosure in some embodiments, it is possible to provide a technique capable of improving characteristics of an oxide film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming an oxide film containing an atom X of a precursor on the substrate by performing a cycle a predetermined number of times, the cycle including non-simultaneously performing:
   (a) forming a first layer containing a component in which a first group is bonded to the atom X on the substrate by supplying the precursor having a molecular structure in which the first group and a second group are bonded to the atom X, to the substrate, the first group containing an alkoxy group, and the second group containing at least one selected from the group of an amino group, an alkyl group, a halogeno group, a hydroxy group, a hydro group, an aryl group, a vinyl group, and a nitro group; and
   (b) forming a second layer containing the atom X by supplying an oxidizing agent to the substrate to oxidize the first layer,
   wherein in (a), the precursor is supplied under a condition in which the atom X is adsorbed on a surface of the substrate in a state where the bonding of the first group and the atom X is maintained.

2. The method according to claim 1, wherein the atom X has four bonding hands,
   wherein the first group is bonded to each of three of the four bonding hands of the atom X, and the second group is bonded to a remaining one of the four bonding hands of the atom X, and
   wherein in (a), the precursor is supplied under a condition in which the atom X is adsorbed on the surface of the substrate in a state where the first group is bonded to each of the three bonding hands of the atom X.

3. The method according to claim 1, wherein a bonding energy between the first group and the atom X is higher than a bonding energy between the second group and the atom X.

4. The method according to claim 1, wherein in (a), the precursor is supplied under a condition in which the second group is desorbed and the first group is not desorbed from the atom X contained in the precursor.

5. The method according to claim 1, wherein in (a), the precursor is supplied under a condition in which the atom X is adsorbed on a surface of the substrate in a state where the second group is desorbed from the atom X.

6. The method according to claim 5, wherein in (a), the precursor is supplied under a condition in which the second group desorbed from the atom X contained in the precursor is not adsorbed on the surface of the substrate.

7. The method according to claim 1, wherein in (a), adsorption of atoms or molecules to the atom X adsorbed on the surface of the substrate is inhibited by the first group bonded to the atom X adsorbed on the surface of the substrate and adsorption of the atoms or the molecules to an adsorption site on the surface of the substrate around the atom X is inhibited.

8. The method according to claim 1, wherein in (a), an adsorption site on the surface of the substrate around the atom X is held by the first group bonded to the atom X adsorbed on the surface of the substrate.

9. The method according to claim 1, wherein in (a), the atom X is adsorbed discontinuously on the surface of the substrate.

10. The method according to claim 1, wherein in (a), the atom X is adsorbed on the surface of the substrate such that a layer made of the atom X has a thickness of less than one atomic layer.

11. The method according to claim 1, wherein in (a), the supply of the precursor is continued until an adsorption reaction of the atom X on the surface of the substrate is saturated.

12. The method according to claim 11, wherein a layer made of the atom X adsorbed on the surface of the substrate has a thickness of less than one atomic layer in a state in which the adsorption reaction of the atom X on the surface of the substrate is saturated.

13. The method according to claim 11, wherein a layer made of the atom X adsorbed on the surface of the substrate is a discontinuous layer in a state in which the adsorption reaction of the atom X on the surface of the substrate is saturated.

14. The method according to claim 11, wherein an adsorption site is held on a portion of the surface of the substrate in a state in which the adsorption reaction of the atom X on the surface of the substrate is saturated.

15. The method according to claim 11, wherein the surface of the substrate is covered with the first group in a state in which the adsorption reaction of the atom X on the surface of the substrate is saturated.

16. The method according to claim 1, wherein in (b), the oxidizing agent is supplied under a condition in which at least one of a third group contained in the first group bonded to the atom X contained in the first layer and the first group bonded to the atom X is desorbed.

17. The method according to claim 1, wherein in (b), the oxidizing agent is supplied under a condition in which a third group contained in the first group bonded to the atom X contained in the first layer and the first group bonded to the atom X are desorbed.

18. The method according to claim 1, wherein a processing temperature in the act of forming the oxide film is set to 550 degrees C. or higher and 700 degrees C. or lower.

19. The method according to claim 1, wherein a processing temperature in the act of forming the oxide film is set to 600 degrees C. or higher and 650 degrees C. or lower.

20. The method according to claim 1, wherein in the act of forming the oxide film, a cycle including sequentially and non-simultaneously performing (a) and (b) is implemented a predetermined number of times after performing (b).

21. A non-transitory computer-readable recording medium storing a program that causes, by a computer, a substrate processing apparatus to perform a process comprising the method of claim 1.

22. A substrate processing apparatus, comprising:
a process chamber in which a substrate is processed;
a precursor supply system configured to supply a precursor having a molecular structure in which a first group and a second group are bonded to an atom X, to the substrate in the process chamber, the first group containing an alkoxy group, and the second group containing at least one selected from the group of an amino group, an alkyl group, a halogeno group, a hydroxy group, a hydro group, an aryl group, a vinyl group, and a nitro group;
an oxidizing agent supply system configured to supply an oxidizing agent to the substrate in the process chamber;
a heater configured to heat the substrate in the process chamber; and
a controller configured to control the precursor supply system, the oxidizing agent supply system, and the heater to perform a process in the process chamber, the process comprising:
  forming an oxide film containing the atom X of the precursor on the substrate by performing a cycle a predetermined number of times, the cycle including non-simultaneously performing:
  (a) forming a first layer containing a component in which the first group is bonded to the atom X on the substrate by supplying the precursor to the substrate; and
  (b) forming a second layer containing the tom X by supplying the oxidizing agent to the substrate to oxidize the first layer,
wherein in (a), the precursor is supplied under a condition in which the atom X is adsorbed on a surface of the substrate in a state where the bonding of the first group and the atom X is maintained.

23. A method of manufacturing a semiconductor device, comprising:
forming an oxide film containing an atom X of a precursor on the substrate by performing a cycle a predetermined number of times, the cycle including non-simultaneously performing:
  (a) forming a first layer containing a component in which a first group is bonded to the atom X on the substrate by supplying the precursor having a molecular structure in which the first group and a second group are bonded to the atom X, to the substrate, the first group containing an alkoxy group, and the second group containing at least one selected from the group of an amino group, an alkyl group, a halogeno group, a hydroxy group, a hydro group, an aryl group, a vinyl group, and a nitro group; and
  (b) forming a second layer containing the atom X by supplying an oxidizing agent to the substrate to oxidize the first layer,
wherein in (a), the precursor is supplied under a condition in which the atom X is adsorbed on a surface of the substrate in a state where the bonding of the first group and the atom X is maintained.

* * * * *